US 8,907,463 B2

(12) United States Patent
Shibata et al.

(10) Patent No.: US 8,907,463 B2
(45) Date of Patent: *Dec. 9, 2014

(54) SEMICONDUCTOR DEVICE INCLUDING STACKED SEMICONDUCTOR CHIPS

(75) Inventors: Kayoko Shibata, Tokyo (JP); Hiroaki Ikeda, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 302 days.

This patent is subject to a terminal disclaimer.

(21) Appl. No.: 13/094,214

(22) Filed: Apr. 26, 2011

(65) Prior Publication Data

US 2011/0201154 A1 Aug. 18, 2011

Related U.S. Application Data

(63) Continuation of application No. 12/759,198, filed on Apr. 13, 2010, now Pat. No. 7,952,201, which is a continuation of application No. 11/418,094, filed on May 5, 2006, now Pat. No. 7,745,919.

(30) Foreign Application Priority Data

May 9, 2005 (JP) ................................ 2005-136659

(51) Int. Cl.
| | | |
|---|---|---|
| H01L 23/02 | (2006.01) | |
| H01L 25/065 | (2006.01) | |
| H01L 23/535 | (2006.01) | |
| H01L 23/544 | (2006.01) | |

(52) U.S. Cl.
CPC ..... *H01L 23/535* (2013.01); *H01L 2225/06527* (2013.01); *H01L 2223/5444* (2013.01); *H01L 25/0657* (2013.01); *H01L 2225/06513* (2013.01); *H01L 2224/16* (2013.01); *H01L 2225/06541* (2013.01); *H01L 23/544* (2013.01)

USPC ........... 257/686; 257/700; 257/713; 257/777; 257/E21.627; 257/E21.641; 438/109; 438/129; 361/803

(58) Field of Classification Search
USPC .......... 257/208, 686, 700, 713, 777, E21.627, 257/E21.641; 438/109, 129; 361/803
See application file for complete search history.

(56) References Cited

U.S. PATENT DOCUMENTS

| | | |
|---|---|---|
| 5,130,894 A | 7/1992 | Miller |
| 5,229,647 A | 7/1993 | Gnadinger |

(Continued)

FOREIGN PATENT DOCUMENTS

| | | |
|---|---|---|
| JP | 04-112209 | 4/1992 |
| JP | 05-013661 | 1/1993 |

(Continued)

OTHER PUBLICATIONS

Chinese Office Action, with English translation, issued in Chinese Patent Application No. CN 200610079485.3, mailed Jun. 13, 2008.

(Continued)

*Primary Examiner* — Su Kim

(57) ABSTRACT

A semiconductor device comprising a plurality of semiconductor chips and a plurality of through-line groups is disclosed. Each of the through-line groups consists of a unique number of through-lines. The numbers associated with the through-line groups are mutually coprime to each other. When one of the through-lines is selected for the each through-line group, one of the semiconductor chip is designated by a combination of the selected through-lines of the plurality of the through-line groups.

12 Claims, 20 Drawing Sheets

(56) References Cited

U.S. PATENT DOCUMENTS

| | | | |
|---|---|---|---|
| 5,585,675 A * | 12/1996 | Knopf | 257/774 |
| 5,682,062 A | 10/1997 | Gaul | |
| 5,995,379 A * | 11/1999 | Kyougoku et al. | 361/803 |
| 6,239,495 B1 | 5/2001 | Sakui et al. | |
| 6,271,587 B1 | 8/2001 | Patti | |
| 6,407,451 B2 | 6/2002 | Akram et al. | |
| 6,448,661 B1 * | 9/2002 | Kim et al. | 257/777 |
| 6,791,175 B2 | 9/2004 | Matsuo et al. | |
| 6,841,883 B1 | 1/2005 | Farnworth et al. | |
| 6,891,447 B2 * | 5/2005 | Song | 333/24 R |
| 7,046,522 B2 * | 5/2006 | Sung et al. | 361/803 |
| 7,123,497 B2 | 10/2006 | Matsui et al. | |
| 7,291,929 B2 | 11/2007 | Tanaka et al. | |
| 7,745,919 B2 | 6/2010 | Shibata et al. | |
| 7,952,201 B2 | 5/2011 | Shibata et al. | |
| 2001/0028114 A1 * | 10/2001 | Hosomi | 257/778 |
| 2002/0036338 A1 | 3/2002 | Matsuo et al. | |
| 2003/0040131 A1 | 2/2003 | Kai | |
| 2005/0014311 A1 | 1/2005 | Hayasaka et al. | |
| 2005/0104181 A1 | 5/2005 | Lee et al. | |
| 2005/0263869 A1 | 12/2005 | Tanaka et al. | |
| 2007/0001281 A1 | 1/2007 | Ishino et al. | |
| 2007/0023887 A1 | 2/2007 | Matsui | |
| 2007/0045780 A1 | 3/2007 | Akram et al. | |
| 2007/0194455 A1 | 8/2007 | Ikeda et al. | |
| 2007/0210447 A1 | 9/2007 | Kinsley | |
| 2008/0048335 A1 | 2/2008 | Han | |
| 2011/0079924 A1 * | 4/2011 | Suh | 257/777 |

FOREIGN PATENT DOCUMENTS

| | | |
|---|---|---|
| JP | 05-046214 | 2/1993 |
| JP | 2001-053217 | 2/2001 |
| JP | 2002-305283 | 10/2002 |
| JP | 2003-060053 | 2/2003 |

OTHER PUBLICATIONS

Japanese Office Action issued in Japanese Patent Application No. JP 2005-136659 dated May 19, 2009.

Japanese Office Action, with partial English translation, issued in Japanese Patent Application No. JP 2005-136659 dated Jan. 5, 2010.

* cited by examiner

| SELECTED CHIP | ASSERTED THROUGH-LINE | |
|---|---|---|
| 1ST CHIP | X1 | Y1 |
| 2ND CHIP | X2 | Y2 |
| 3RD CHIP | X3 | Y3 |
| 4TH CHIP | X4 | Y1 |
| 5TH CHIP | X1 | Y2 |
| 6TH CHIP | X2 | Y3 |
| 7TH CHIP | X3 | Y1 |
| 8TH CHIP | X4 | Y2 |
| 9TH CHIP | X1 | Y3 |
| 10TH CHIP | X2 | Y1 |
| 11TH CHIP | X3 | Y2 |
| 12TH CHIP | X4 | Y3 |

FIG. 2

| SELECTED CHIP | ASSERTED THROUGH-LINE | |
|---|---|---|
| 1ST CHIP | X1 | Y1 |
| 2ND CHIP | X2 | Y2 |
| 3RD CHIP | X3 | Y3 |
| 4TH CHIP | X4 | Y4 |
| 5TH CHIP | X1 | Y5 |
| 6TH CHIP | X2 | Y1 |
| 7TH CHIP | X3 | Y2 |
| 8TH CHIP | X4 | Y3 |
| 9TH CHIP | X1 | Y4 |
| 10TH CHIP | X2 | Y5 |
| 11TH CHIP | X3 | Y1 |
| 12TH CHIP | X4 | Y2 |
| 13TH CHIP | X1 | Y3 |
| 14TH CHIP | X2 | Y4 |
| 15TH CHIP | X3 | Y5 |
| 16TH CHIP | X4 | Y1 |
| 17TH CHIP | X1 | Y2 |
| 18TH CHIP | X2 | Y3 |
| 19TH CHIP | X3 | Y4 |
| 20TH CHIP | X4 | Y5 |

FIG. 3

| SELECTED CHIP | BANK ADDRESS | | | THROUGH-LINE | | | | | | |
|---|---|---|---|---|---|---|---|---|---|---|
| | BA2 | BA1 | BA0 | X4 | X3 | X2 | X1 | Y3 | Y2 | Y1 |
| CHIP 10 | 0 | 0 | 0 | 0 | 0 | 0 | 1 | 0 | 0 | 1 |
| CHIP 20 | 0 | 0 | 1 | 0 | 0 | 1 | 0 | 0 | 1 | 0 |
| CHIP 30 | 0 | 1 | 0 | 0 | 1 | 0 | 0 | 1 | 0 | 0 |
| CHIP 40 | 0 | 1 | 1 | 1 | 0 | 0 | 0 | 0 | 0 | 1 |
| CHIP 50 | 1 | 0 | 0 | 0 | 0 | 0 | 1 | 0 | 1 | 0 |
| CHIP 60 | 1 | 0 | 1 | 0 | 0 | 1 | 0 | 1 | 0 | 0 |
| CHIP 70 | 1 | 1 | 0 | 0 | 1 | 0 | 0 | 0 | 0 | 1 |
| CHIP 80 | 1 | 1 | 1 | 1 | 0 | 0 | 0 | 0 | 1 | 0 |

FIG. 5

SEMICONDUCTOR DEVICE INCLUDING STACKED SEMICONDUCTOR CHIPS

CROSS-REFERENCE TO RELATED APPLICATIONS

This application is a Continuation of U.S. application Ser. No. 12/759,198, filed on Apr. 13, 2010 now U.S. Pat. No. 7,952,201, which is a Continuation of U.S. application Ser. No. 11/418,094, filed on May 5, 2006, now U.S. Pat. No. 7,745,919, claiming priority of Japanese Patent Application No. 2005-136659, filed on May 9, 2005, the entire contents of each of which are hereby incorporated by reference.

BACKGROUND OF THE INVENTION

This invention relates to a semiconductor device comprising semiconductor chips stacked and, particularly, to a chip selection or designation technique.

Various techniques for chip selection or designation in multi-chip semiconductor device are known using a plurality of through-lines that are pierced through multiple chips. For example, known techniques are disclosed in U.S. Pat. No. 6,448,661 and U.S. Pat. No. 6,649,428, which are incorporated herein by reference in their entireties.

SUMMARY OF THE INVENTION

It is an object of the present invention to provide a new arrangement of a plurality of through-lines in a semiconductor device.

According to one aspect of the present invention, a semiconductor device comprises a plurality of semiconductor chips and a predetermined number of through-lines. Each of the through-lines constitutes an electrical path shared by the plurality of the semiconductor chips. The semiconductor chips are stacked along a predetermined direction. The through-lines are arranged in accordance with a predetermined configuration and are pierced through the semiconductor chips. The predetermined configuration is represented by a predetermined simple directed cycle in a plane perpendicular to the predetermined direction. The predetermined simple directed cycle consists of the predetermined number of nodes and the predetermined number of directed edges each of which connects two nodes among the predetermined number of the nodes.

An appreciation of the objectives of the present invention and a more complete understanding of its structure may be had by studying the following description of the preferred embodiment and by referring to the accompanying drawings.

BRIEF DESCRIPTION OF THE DRAWINGS

FIG. 2 is a table for use in describing an example of a chip selection or designation method;

FIG. 3 is a table for use in describing another example of a chip selection or designation method;

FIG. 5 is a table showing an assertion rule which is used in a through-line assertion circuit included in the interface chip of FIG. 4;

Figure 1:
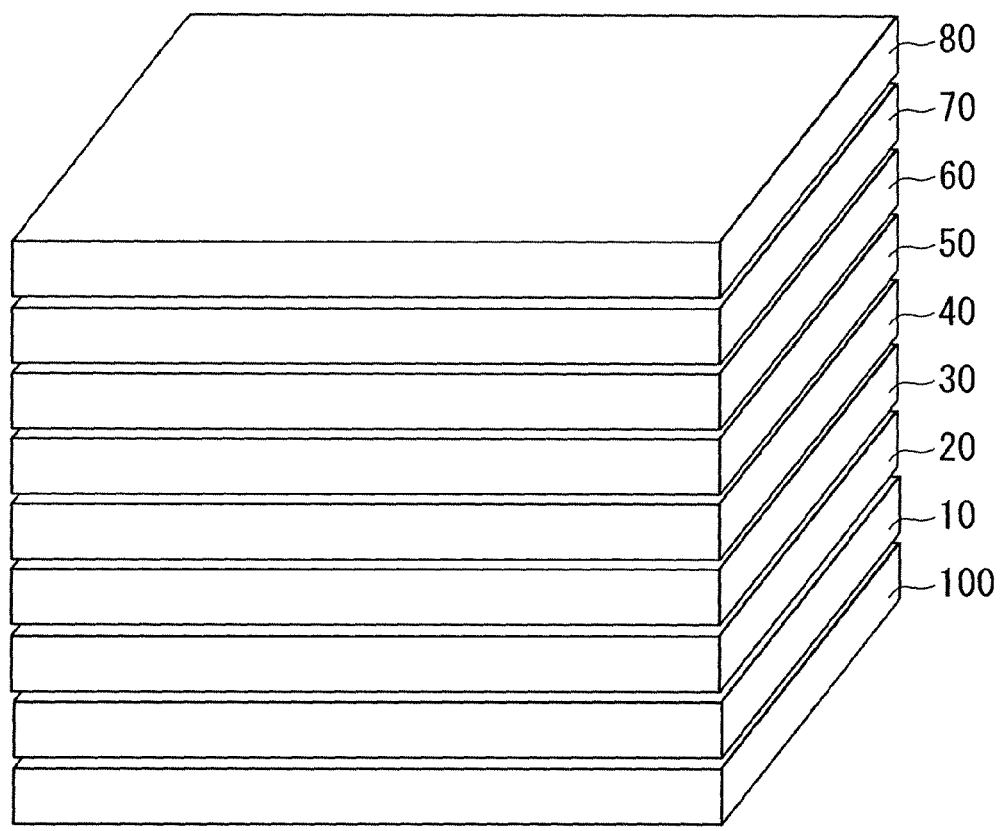
FIG. 1 is a view schematically showing a structure of a semiconductor device in accordance with a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

A semiconductor device according to a first embodiment of the present invention is a dynamic random access memory (DRAM) device and comprises a plurality of DRAM chips 10-80 as a plurality of semiconductor chips and an interface chip 100, as shown in FIG. 1. However, the present invention is not limited to the DRAM device but may be another semiconductor device comprising a plurality of semiconductor chips other than DRAM chips.

In the illustrated DRAM device, eight DRAM chips 10-80 are stacked on the interface chip 100. The DRAM device is provided with a plurality of through-lines each of which is pierced through the DRAM chips 10-80 so that each through-line constitutes an electrical path shared by the DRAM chips 10-80; the through-lines are used for selecting, designating or identifying each DRAM chips 10-80.

The through-lines are grouped into a plurality of through-line groups. Each through-line group consists of through-lines whose number is unique to the through-line group. The numbers of the through-lines belonging to the through-line groups are mutually "coprime" to each other. The term "coprime" is used in mathematical meaning and is equal to "relatively prime"; for example, two integers x and y are coprime or relatively prime if their greatest common divisor is 1. Likewise, if the greatest common divisor of integers x, y and z is 1, the integers x, y and z are coprime.

To be noted here that the number of possible combinations of coprime numbers is larger than the total number of the coprime numbers. Based on the relation in number, a larger number of semiconductor chips are distinguished designated by using a smaller number of through-lines, in accordance with the present embodiment. For example, seven through-lines are grouped into two through-line groups; one through-line group consists of four through-lines X1-X4, while the other consists of three through-lines Y1-Y3. If one through-line is selected for each through-line group and is asserted, the number of possible combinations of the asserted through-lines becomes twelve. Thus, the grouping of seven through-lines into four through-lines and three through-lines provides distinguishablity of twelve semiconductor chips, as shown in FIG. 2. Furthermore, if nine through-lines are grouped into two groups, four through-lines X1-X4 and five through-lines Y1-Y5, twenty semiconductor chips become designatable by selecting and asserting one through-line for each through-line groups, as shown in FIG. 3. Likewise, if ten through-lines are grouped into three groups, 2, 3 and 5 through-lines, respectively, thirty semiconductor chips ($30=2\times3\times5$) become distinguishable.

In this embodiment, there are seven through-lines in total, and they are grouped into two through-line groups, through-lines X1-4 and through-lines Y1-Y3. On the other hand, as mentioned above, there are eight DRAM chips 10-80. In this embodiment, three bank addresses BA0, BA1, BA2 are used for selection/designation of one DRAM chip among the DRAM chips 10-80. In other words, the bank addresses serve as designation signals for designation of DRAM chips in this embodiment.

Figure 4:
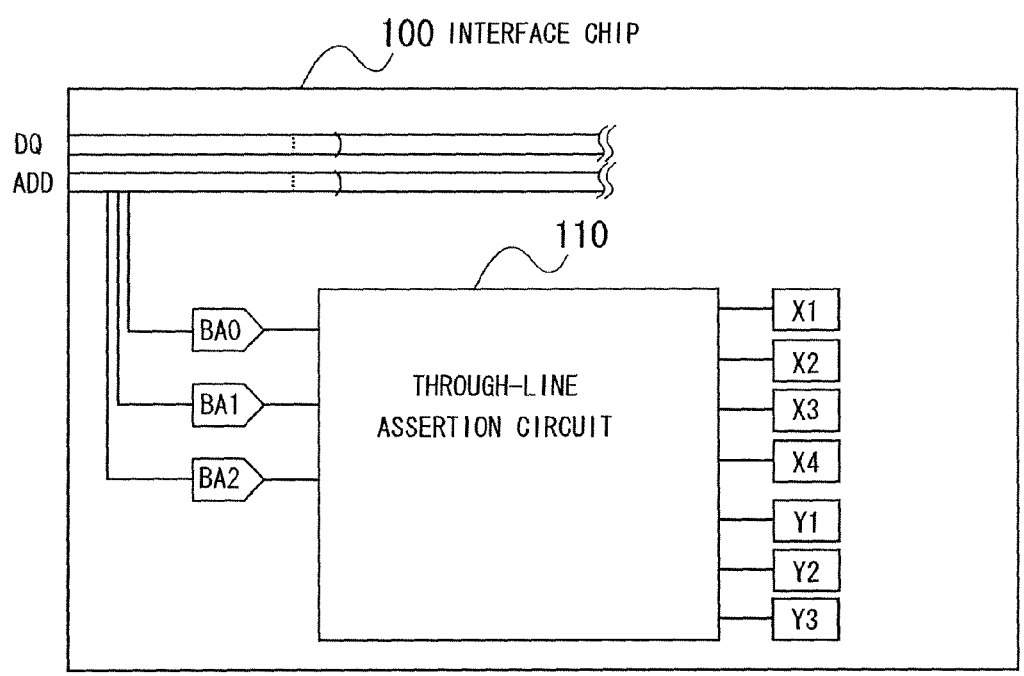
FIG. 4 is a view schematically showing a structure of an interface chip included in the semiconductor device of FIG. 1.

With reference to FIG. 4, the interface chip 100 comprises a through-line assertion circuit 110 operable in accordance with a truth table of FIG. 5; the truth table defines the relation between the bank addresses BA0-BA2 and the asserted through-lines X1-X4 and Y1-Y3. The through-line assertion circuit 110 is adapted to select a combination of a through-line X1, X2, X3 or X4 and another through-line Y1, Y2 or Y3 on the basis of the bank addresses BA0-BA2, and to assert the selected combination. As understood from FIG. 2, there is a possibility of designation of twelve DRAM chips at maximum. Therefore, if there is a further bank address BA3 and if the bank address BA3 is also used for designation of DRAM chips, twelve DRAM chips can be distinguished by using seven through-lines X1-X4 and Y1-Y3. In other words, the input number and/or the output number as to the through-line assertion circuit 110 are not limited to the present embodiment.

Figure 6:
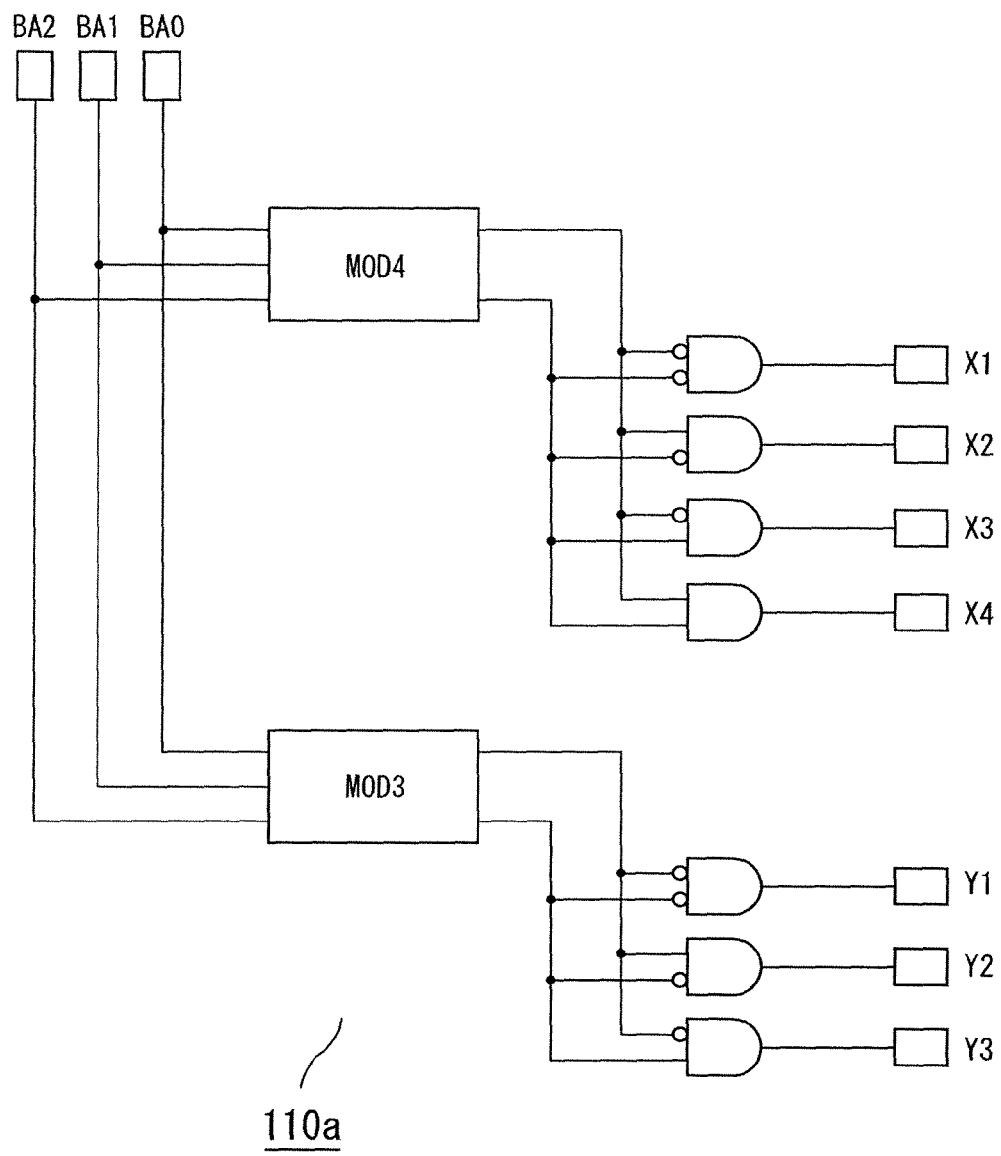
FIG. 6 is a view schematically showing an example of the through-line assertion circuit of FIG. 4.

With reference to FIG. 6, there is shown an example of the through-line assertion circuit 110a, which comprises a MOD3 circuit and a MOD4 circuit and a plurality of primitive elements or gates. The illustrated through-line assertion circuit 110a has an ability of twelve chip designation if the further bank address BA3 is delivered to the MOD3 circuit and the MOD4 circuit.

Figure 7:
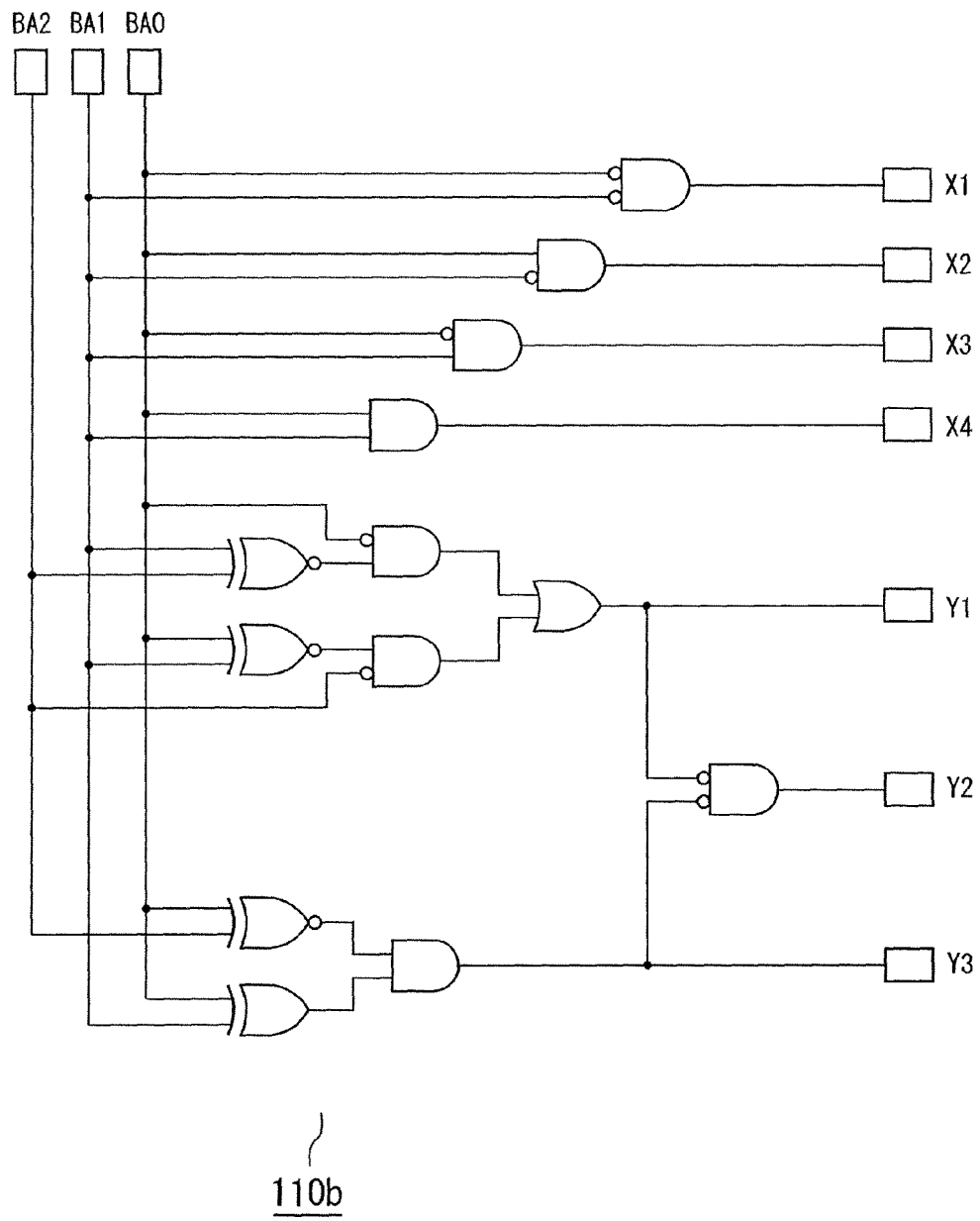
FIG. 7 is a view schematically showing another example of the through-line assertion circuit of FIG. 4.

With reference to FIG. 7, there is shown another example of the through-line assertion circuit 110b, which consists of a smaller number of primitive gates. The illustrated through-line assertion circuit 110b is able to designate only eight chips.

Figure 8:
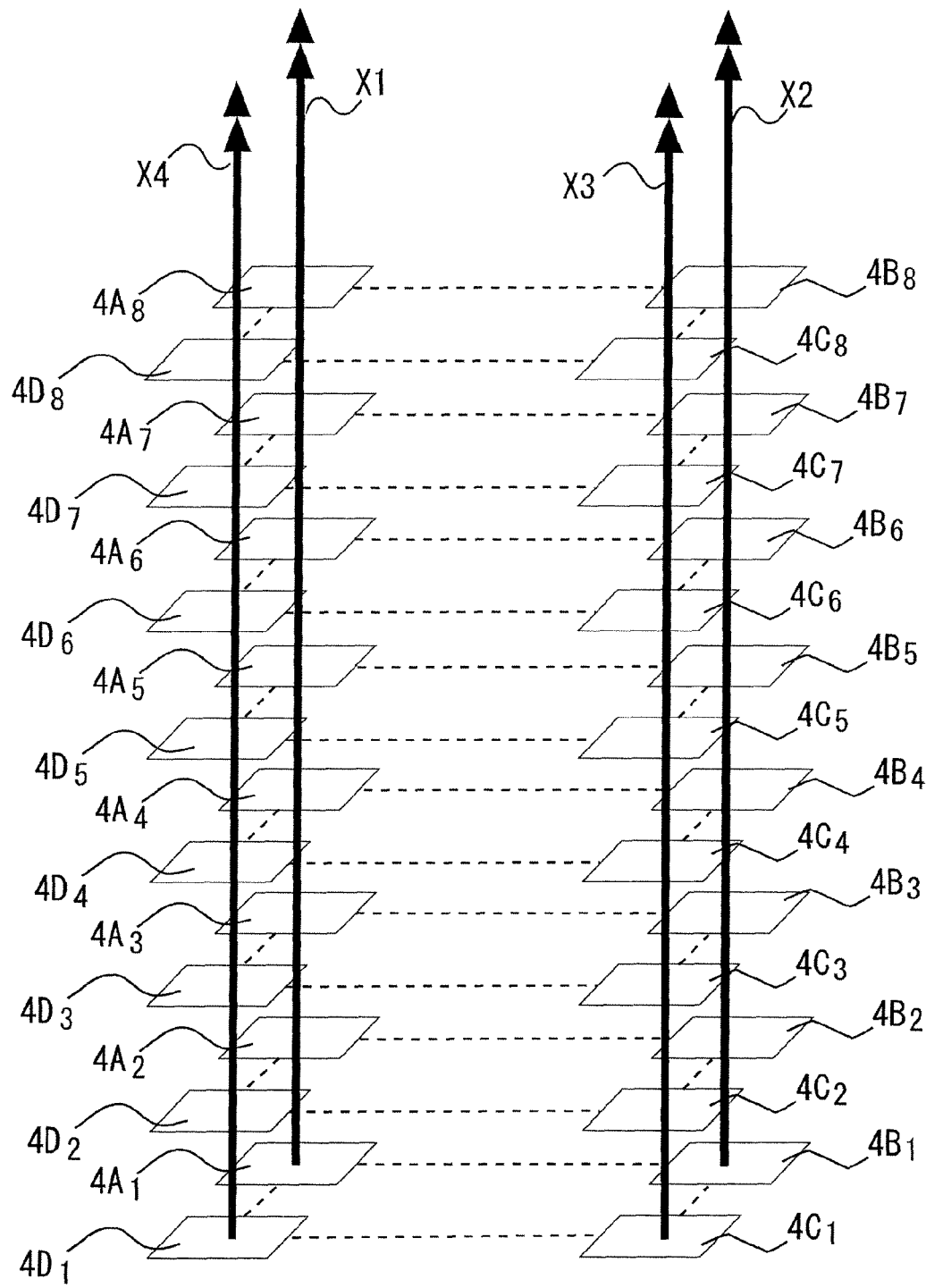
FIG. 8 is a view schematically showing through-lines in accordance with the first embodiment.
Figure 9:
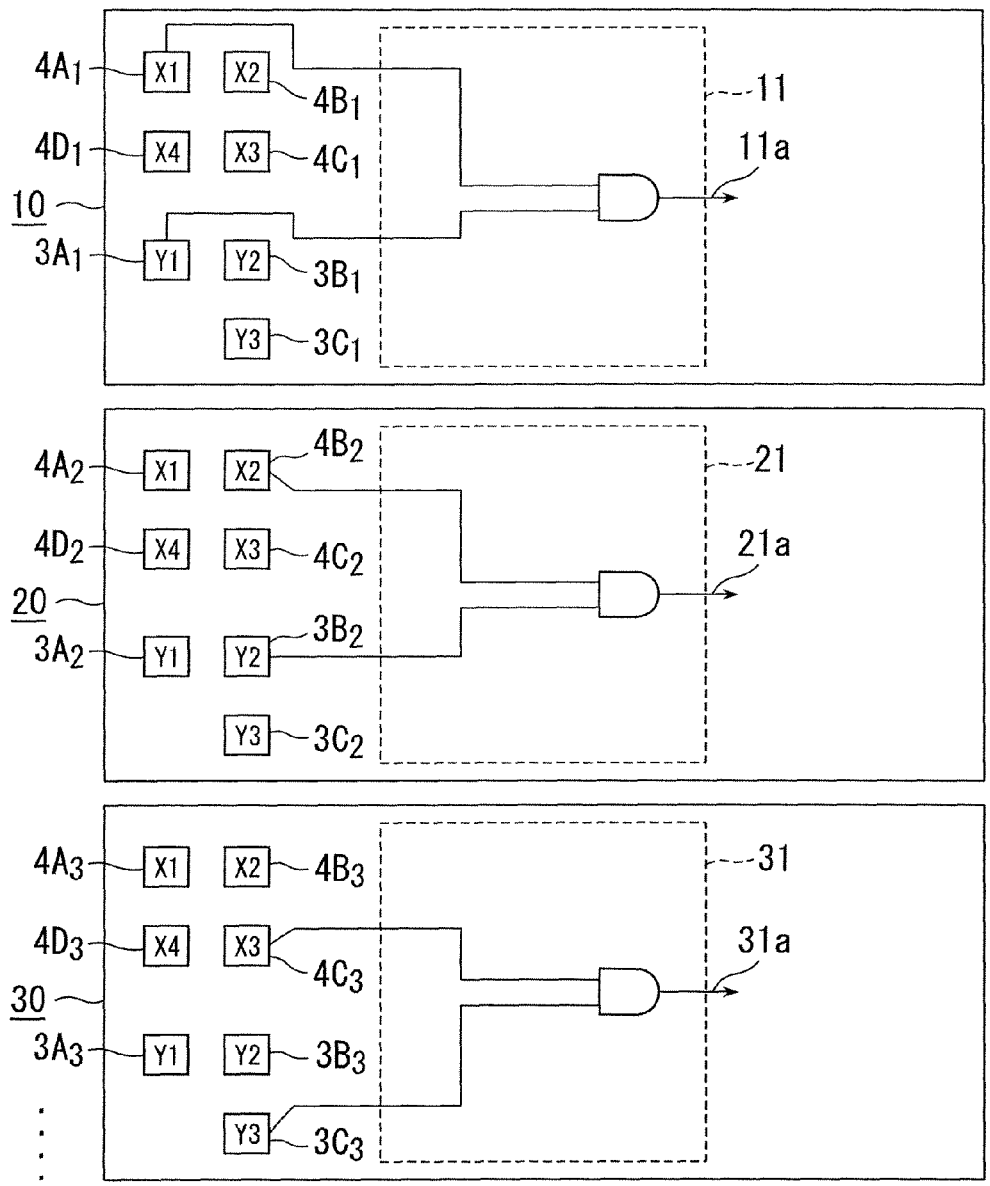
FIG. 9 is a view schematically showing a structure of a semiconductor chip of the first embodiment.

With reference to FIGS. 8 and 9, the DRAM chips 10-80 have terminals arranged in accordance with the same configuration; in FIGS. 8 and 9, each terminal is depicted with 4A, 4B, 4C or 4D and its subscript of a layer number of the DRAM chip to which the terminal belongs. As apparent from FIGS. 8 and 9, the terminals $4A_1$-$4A_8$, $4B_1$-$4B_8$, $4C_1$-$4C_8$, and $4D_1$-$4D_8$ are arranged in accordance with a rectangular configuration in each DRAM chip 10-80, and each of the through-lines X1-X4 extends in a straight form. Similarly, other terminals associated with the other group of the through-lines Y1-Y3 are arranged in accordance with a triangular configuration in each DRAM chip 10-80, and each of the through-lines Y1-Y3 extends in a straight form.

Because the through-lines have the straight forms, the asserted terminals corresponding to each DRAM chip 10-80 are different from those of the other DRAM chips, as shown in FIG. 9. Therefore, each of the DRAM chip 10-80 has an internal signal generation circuit 11, 21, 31 which is adapted to generate an internal signal 11a, 21a, 31a on the basis of the unique combination of the asserted terminals for each DRAM chip, wherein the internal signal 11a, 21a, 31a is indicative of selection of the DRAM chip where the internal signal generation circuit 11, 21, is provided. In other words, the DRAM chips 10-80 require layer-specific internal signal generation circuits so that the DRAM chips 10-80 have different structures than each other. For example, the internal signal generation circuit 11 provided for the DRAM chip 10 is connected to the terminals $4A_1$ and $3A_1$; the internal signal generation circuit 21 provided for the DRAM chip 20 is connected to the terminals $4A_2$ and $3A_2$; and the internal generation circuit 31 provided for the DRAM chip 30 is connected to the terminals $4A_3$ and $3A_3$.

A DRAM device according to a second embodiment of the present invention is a modification of the DRAM device of the first embodiment. The DRAM device of the second embodiment comprises an interface chip and a plurality of DRAM chips, wherein the interface chip is the same one as that of the first embodiment, while the DRAM chips are different from those of the first embodiment and have the same structure as each other, as described in detail below.

In the following description, the terminology in graph theory is used; the words are briefly explained here. A cycle is a word used in graph theory and is a closed path whose start node and end node are the same. A directed cycle consists of nodes and directed edges or arcs. In other words, a directed cycle includes no undirected edges; all nodes included in the simple directed cycle are ordered. A simple directed cycle is a directed cycle with no repeated nodes. In other words, the number of nodes is equal to the number of directed edges in a simple directed cycle.

Figure 10:
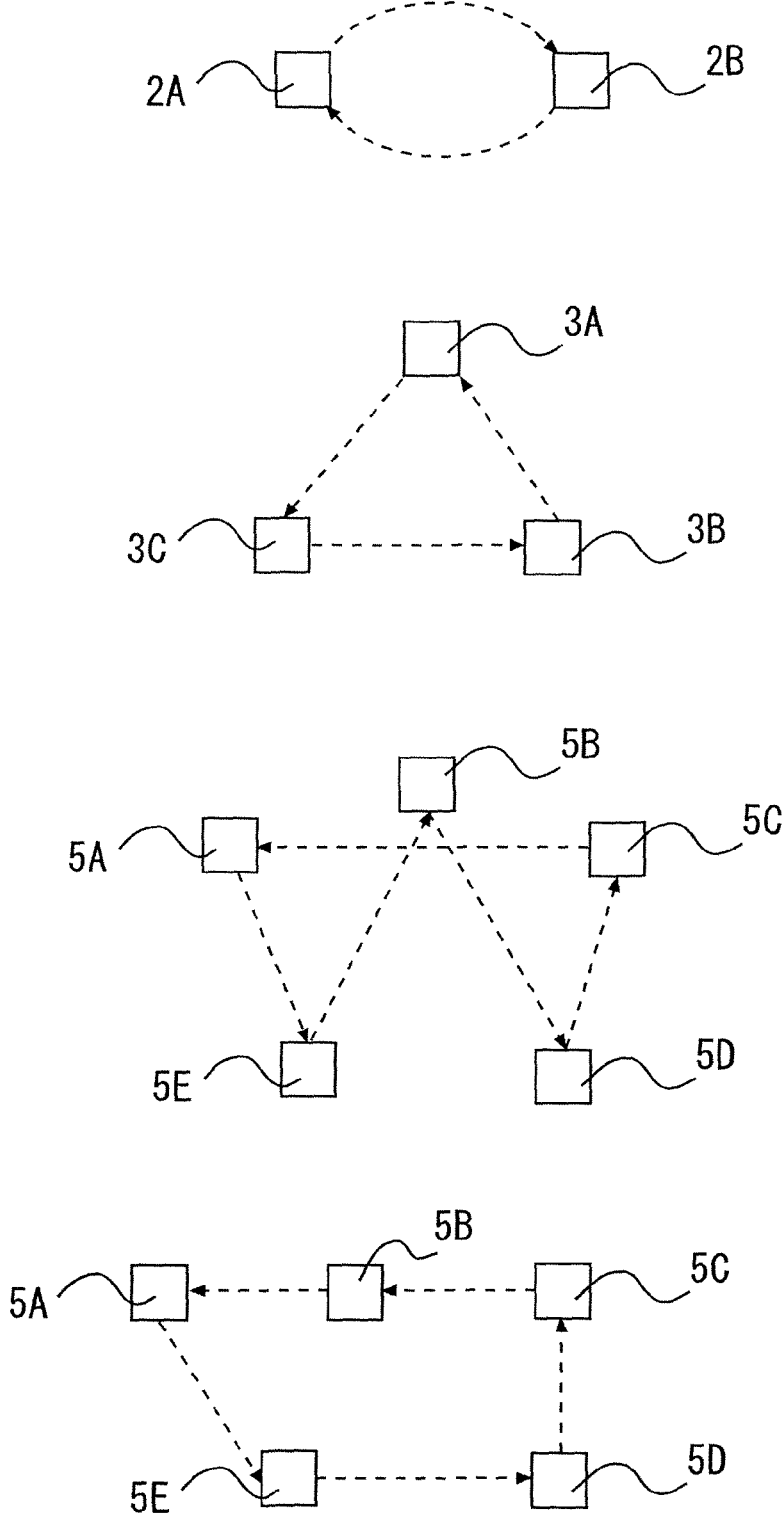
FIG. 10 is a view showing various types of simple directed cycle graphs.

Various simple directed cycles are illustrated in FIG. 10. The first one has two nodes 2A and 2B. The second one has three nodes 3A-3C. In theory, the third one is also a simple directed cycle in which the nodes 5A, 5E, 5B, 5D, 5C are repeatedly ordered in this order. Furthermore, the fourth one is a simple directed cycle, too, wherein the nodes 5A-5C are physically arranged on a common straight line.

Figure 11:
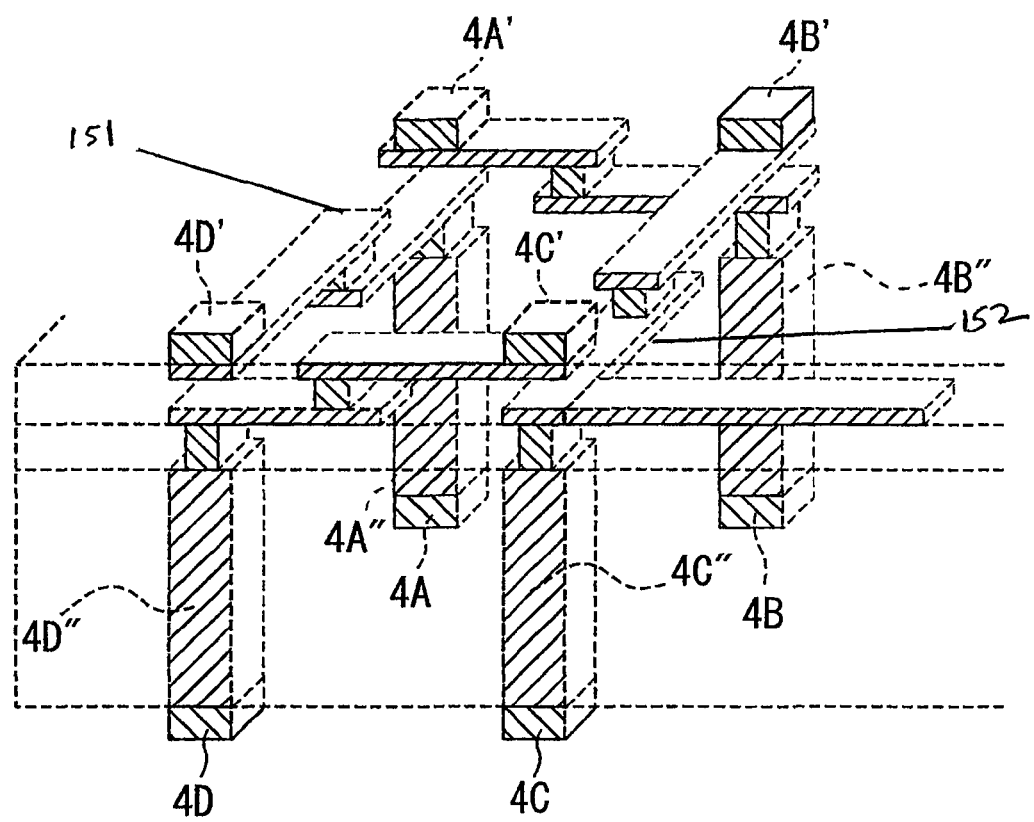
FIG. 11 is a transparent view showing a part of a semiconductor chip according to a second embodiment of the present invention.

With reference to FIG. 11, each of the DRAM chips comprises components constituting the through-lines X1-X4. In detail, each DRAM chip has lower and upper surfaces and comprises four lower terminals 4A-4D, four upper terminals 4A'-4D' and four connection portions. The lower terminals 4A-4D are formed on the lower surface of the DRAM chip. On the other hand, the upper terminals 4A'-4D' are formed on the upper surface of the DRAM chip. The lower terminals 4A-4D are arranged in correspondence with the upper terminals 4A'-4D', respectively. In other words, the upper terminals 4A'-4D' are arranged above the lower terminals 4A-4D, respectively. However, the upper terminals 4A', 4B', 4C', 4D' are not connected to the lower terminals 4A, 4B, 4C, 4D, respectively, but are connected by the connection portions 4B", 4C", 4D", 4A" to the lower terminals 4B, 4C, 4D, 4A, respectively, as shown in FIG. 11. In other words, there is a simple directed cycle which circulates according to the order "4D-4C-4B-4A-4D", and each of the connection portions 4B", 4C", 4D", 4A" connects one of the lower terminals 4B, 4C, 4D, 4A and one of the upper terminals 4A', 4B', 4C', 4D' in accordance with one of the directed edges 150. The first directed edge 151 corresponding to the connection portion 4B" has start and end nodes which correspond to the lower terminal 4B and the upper terminal 4A', respectively. The second directed edge 152 corresponding to the connection portion 4C" has start and end nodes which correspond to the lower terminal 4C and the upper terminal 4B', respectively. The directed edge corresponding to the connection portion 4D" has start and end nodes which correspond to the lower terminal 4D and the upper terminal 4C', respectively. The directed edge corresponding to the connection portion 4A" has start and end nodes which correspond to the lower terminal 4A and the upper terminal 4D', respectively.

Figure 12:
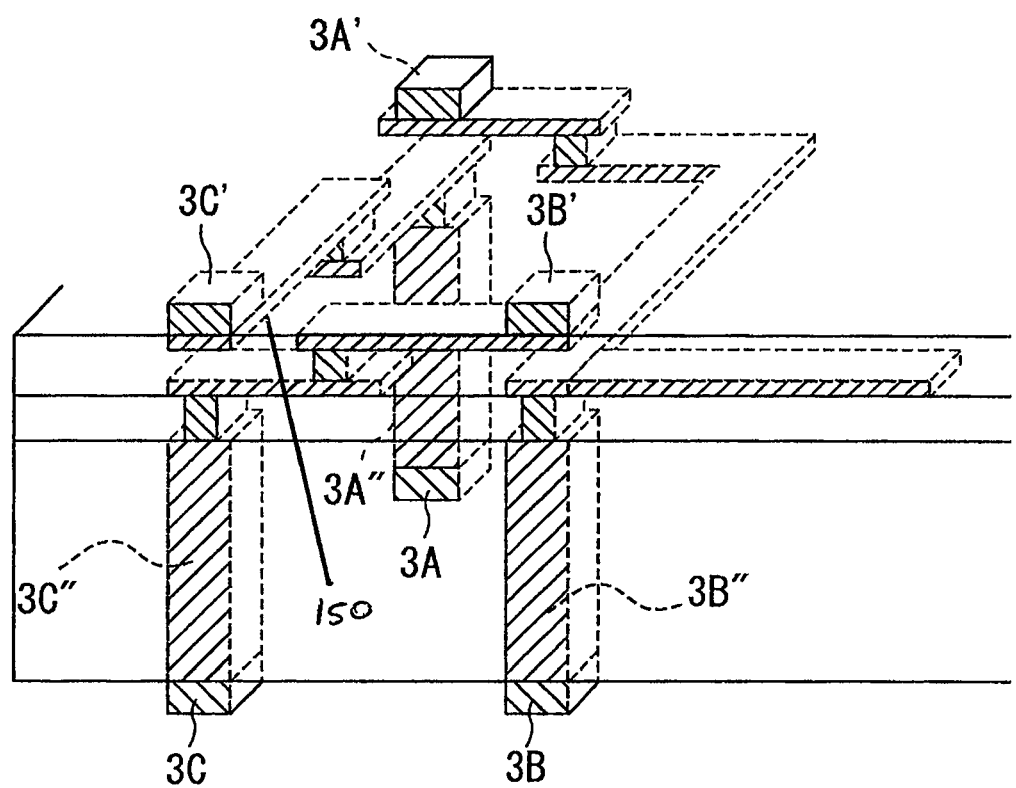
FIG. 12 is a transparent view showing another part of the semiconductor chip of FIG. 11.

Likewise, each of the DRAM chips further comprises components constituting the through-lines Y1-Y3, as shown in FIG. 12. In detail, each DRAM chip further comprises three lower terminals 3A-3C, three upper terminals 3A'-30' and three connection portions 3A"-30". The lower terminals 3A-3C are formed on the lower surface of the DRAM chip. On the other hand, the upper terminals 3A'-3C' are formed on the upper surface of the DRAM chip. The lower terminals 3A-3C are arranged in correspondence with the upper terminals 3A'-3C', respectively. The upper terminals 3A', 3B', 3C' are connected by the connection portions 3B", 3C", 3A" to the lower terminals 3B, 3C, 3A, respectively, as shown in FIG. 12. In other words, there is a simple directed cycle which circulates according to the order "3C-3B-3A-3C", and each of the connection portions 3B", 3C", 3A" connects one of the lower terminals 3B, 3C, 3A and one of the upper terminals 3A', 3B', 3C' in accordance with one of the directed edges. The directed edge corresponding to the connection portion 3B" has start and end nodes which correspond to the lower terminal 3B and the upper terminal 3A', respectively. The directed edge corresponding to the connection portion 3C" has start and end nodes which correspond to the lower terminal 3C and the upper terminal 3B', respectively. The directed edge corresponding to the connection portion 3A" has start and end nodes which correspond to the lower terminal 3A and the upper terminal 3C', respectively.

Figure 13:
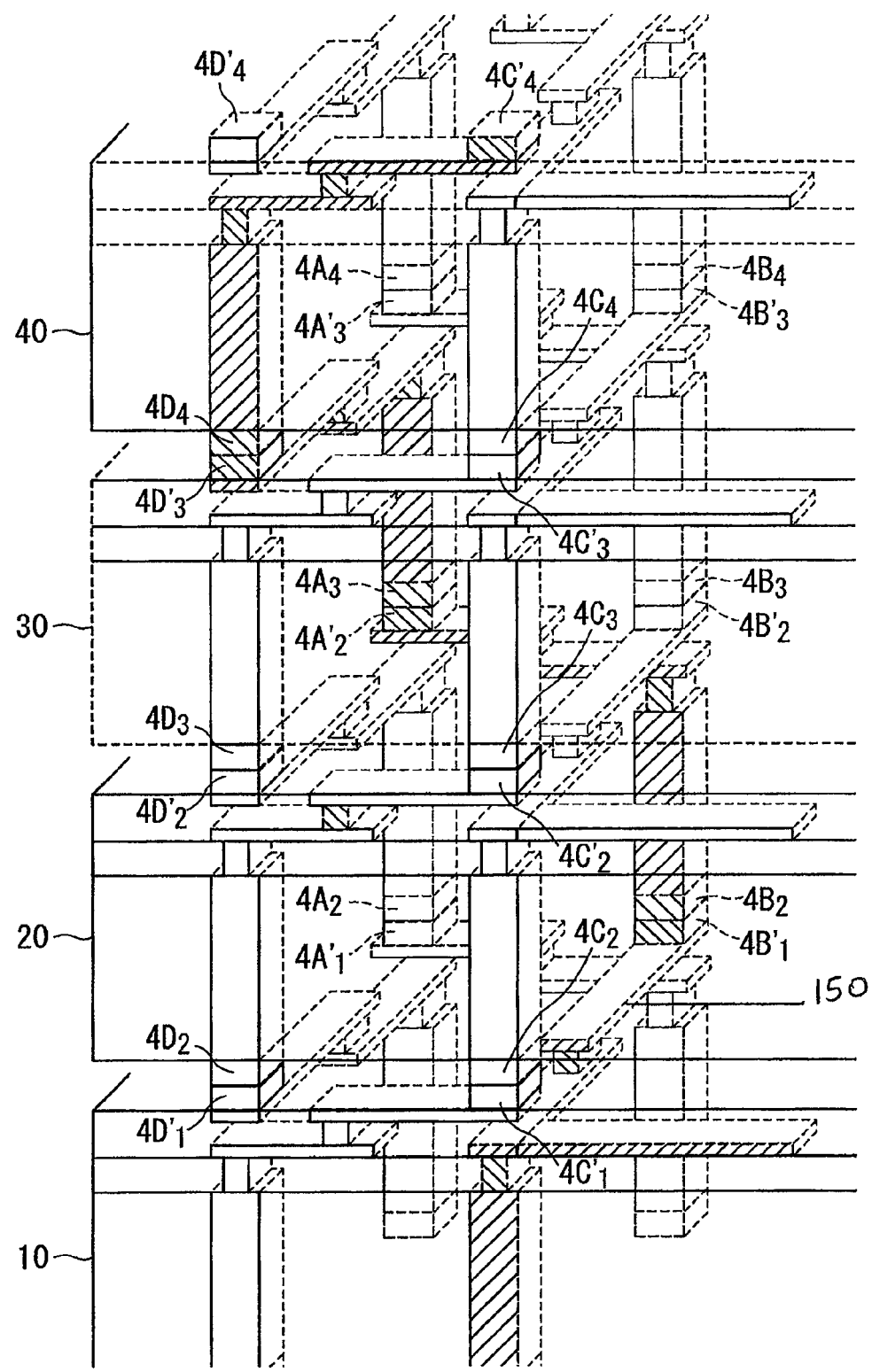
FIG. 13 is a transparent view showing a part of a semiconductor device of the second embodiment, wherein the semiconductor chips of FIG. 11 are stacked.
Figure 14:
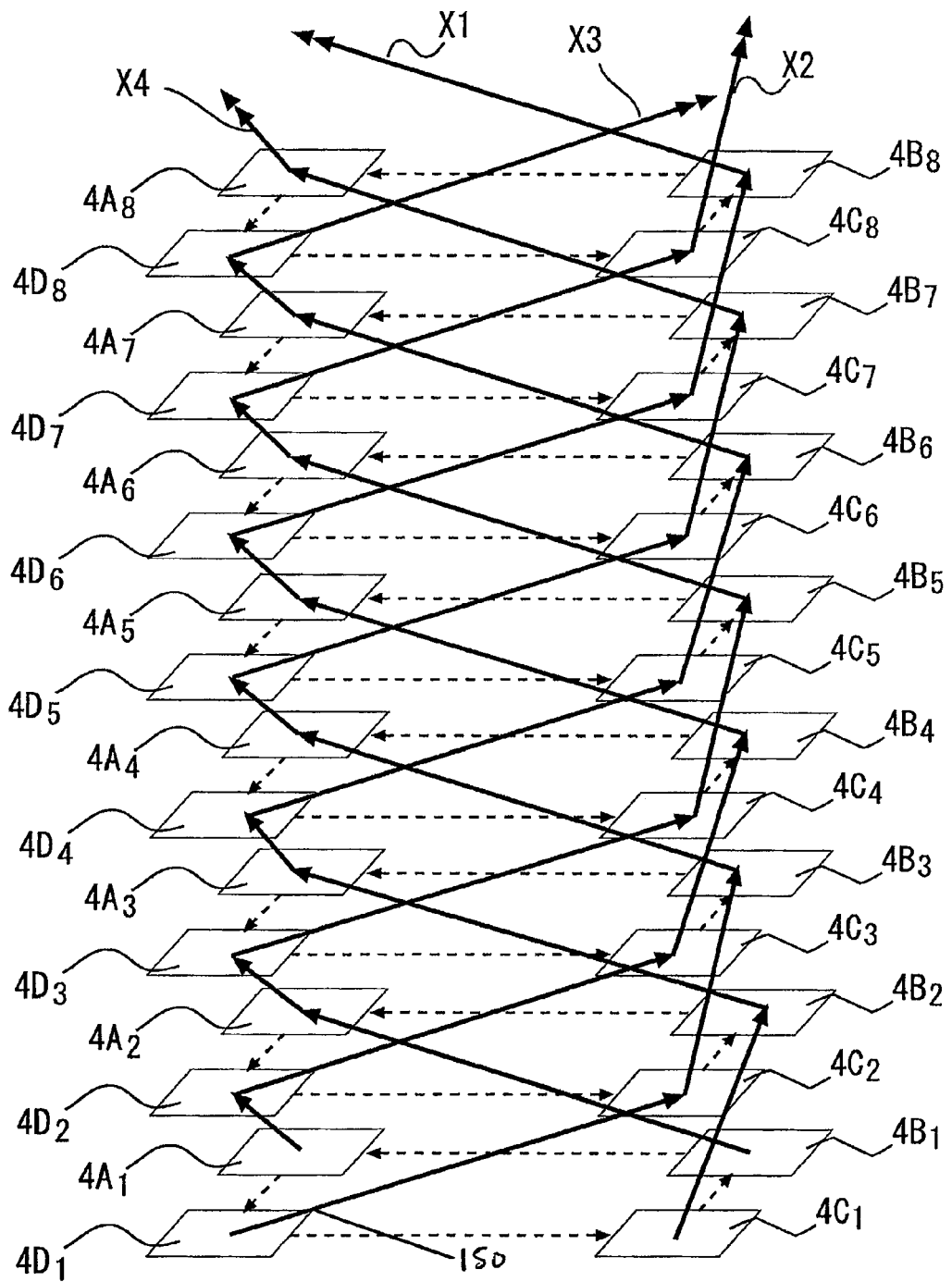
FIG. 14 is a view schematically showing through-lines in accordance with the second embodiment.

As shown in FIG. 13, the DRAM chips with the above-mentioned structures are stacked so that the through-lines X1-X4 as well as the through lines Y1-Y3 are formed as shown in FIG. 14. In detail, the DRAM chip 20 is stacked on the DRAM chip 10 so that the lower terminals $4A_2$-$4D_2$ of the DRAM chip 20 are mounted and connected to the upper terminals $4A'_1$-$4D'_1$ of the DRAM chip 10; the lower terminals $4A_3$-$4D_3$ of the DRAM chip 30 are connected to the upper terminals $4A'_2$-$4D'_2$ of the DRAM chip 20; the lower terminals $4A_4$-$4D_4$ of the DRAM chip 40 are connected to the upper terminals $4A'_3$-$4D'_3$ of the DRAM chip 30. Thus, the through-lines X1-X4 are formed by the lower terminals $4A_n$-$4D_n$, the upper terminals $4A'_n$-$4D'_n$ and the connection portions $4A''_n$-$4D''_n$. The other through-lines Y1-Y3 are also formed simultaneously upon the stacking the DRAM chips.

Thus obtained through-lines X1-X4 have helix forms, respectively, as shown in FIG. 14. Especially, each of the helix form is a polygonal helix. In detail, a polygon is a closed planar path composed of a finite number of sequential line segments. The straight line segments that make up the polygon are called its sides or edges and the points where the sides meet are the polygon's vertices. A simple polygon is a polygon that has a single, non-intersecting boundary. A polygonal helix is a helix that has a polygon form as seen along its helical axis.

Figure 15:
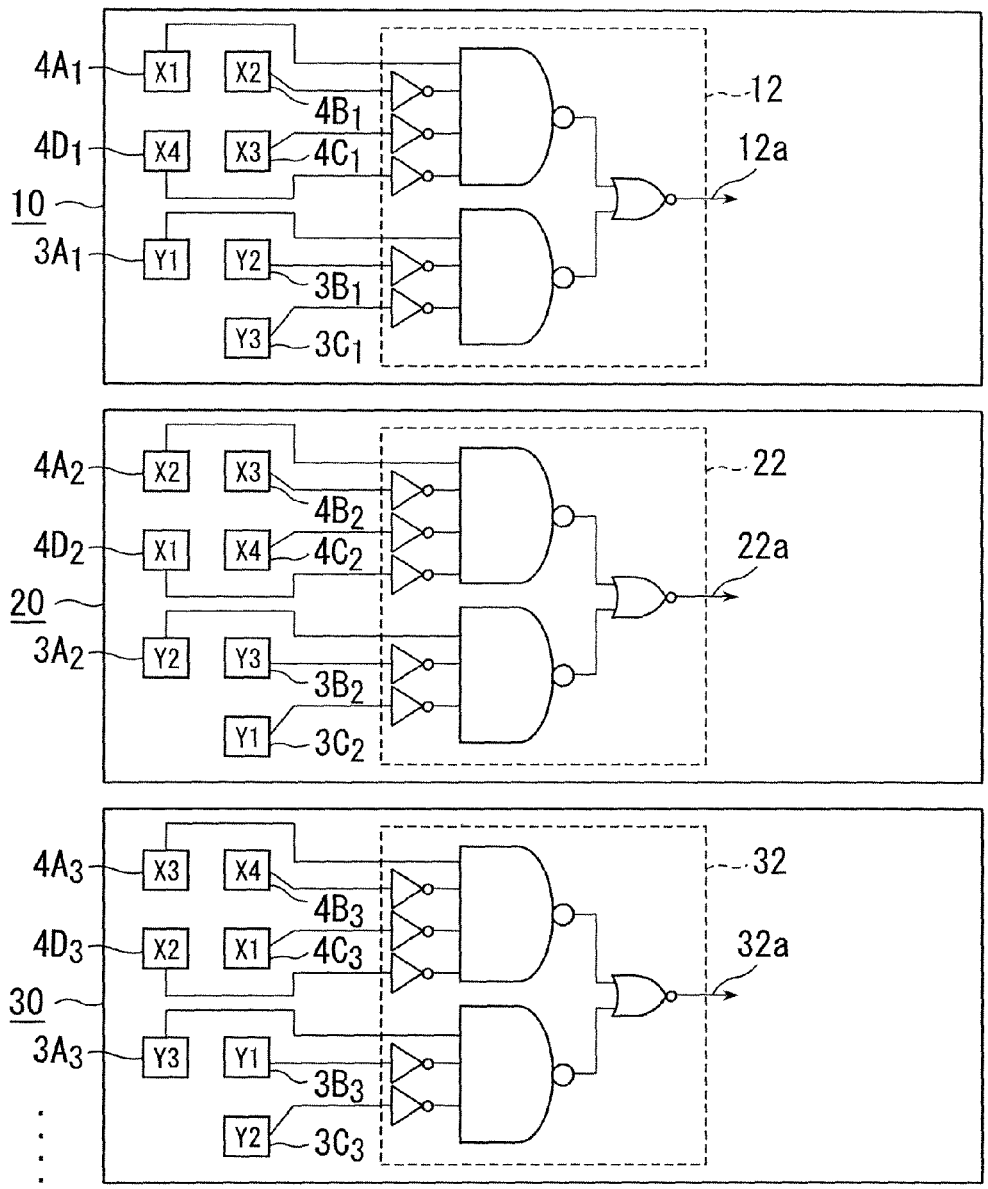
FIG. 15 is a view schematically showing a structure of a semiconductor chip of the second embodiment.

With reference to FIG. 15, the DRAM chips 10, 20, 30 have the same structure as each other. In detail, the DRAM chips 10, 20, 30 have the same structured internal signal generation circuits 12, 22, 32 adapted to generate an internal signals 12a, 22a, 32a, respectively.

To be noted here that in this embodiment, each of the through-lines X1-X4, Y1-Y3 does not have a straight form and passes through the terminals corresponding to the different positions on the DRAM chips, respectively, as shown in FIGS. 14 and 15. For example, the through-line X1 passes through the terminal $4A_1$ of the DRAM chip 10, the terminal $4D_2$ of the DRAM chip 20 and the terminal $4C_3$ of the DRAM chip 30; the through-line X2 passes through the terminal $4B_1$ of the DRAM chip 10, the terminal $4A_2$ of the DRAM chip 20 and the terminal $4D_3$ of the DRAM chip 30; the through-line X3 passes through the terminal $4C_1$ of the DRAM chip 10, the terminal $4B_2$ of the DRAM chip 20 and the terminal $4A_3$ of the DRAM chip 30; and the through-line X4 passes through the terminal $4D_1$ of the DRAM chip 10, the terminal $4C_2$ of the DRAM chip 20 and the terminal $4B_3$ of the DRAM chip 30. Likewise, the through-line Y1 passes through the terminal $3A_1$ of the DRAM chip 10, the terminal $3C_2$ of the DRAM chip 20 and the terminal $3B_3$ of the DRAM chip 30; the through-line Y2 passes through the terminal $3B_1$ of the DRAM chip 10, the terminal $3A_2$ of the DRAM chip 20 and the terminal $3C_3$ of the DRAM chip 30; and the through-line Y3 passes through the terminal $3C_1$ of the DRAM chip 10, the terminal $3B_2$ of the DRAM chip 20 and the terminal $3A_3$ of the DRAM chip 30.

With reference to FIGS. 5, 14 and 15, each of the DRAM chips is designated or selected when the combination of the terminals $4A_n$ and the terminal $3A_n$ is asserted, where n is integer of 1 to 8 and corresponds to a layer number of the DRAM chip 10-80. The terminals $4A_n$ and the terminal $3A_n$ are referred to as specific terminals. The specific terminals $4A_n$ and $3A_n$ are positioned at particular vertices on the rectangle configuration and the triangle configuration, respectively. On each DRAM chip 10, 20, 30, the internal signal generation circuit 12, 22, 32 is coupled to the specific terminals $4A_n$ and $3A_n$ and is adapted to generate the internal signal 12a, 22a, 32a based on the specific terminals $4A_n$ and $3A_n$. In this embodiment, the internal signal generation circuits 12, 22, 32 are also connected to the terminals $4B_n$-$4D_n$ and the terminals $3B_n$ and $3C_n$ in the same manner for every DRAM chip. The thus-structured internal signal generation circuit 12, 22, 32 does not generate the internal signal 12a, 22a, 32a when the terminal $4B_n$-$4D_n$ or the terminal $3B_n$, $3C_n$ is asserted even if the specific terminals $4A_n$ and $3A_n$ is asserted. Thus, the internal signal generation circuits 12, 22, 32 can prevent incorrect actions and have high-reliability.

Figure 16:
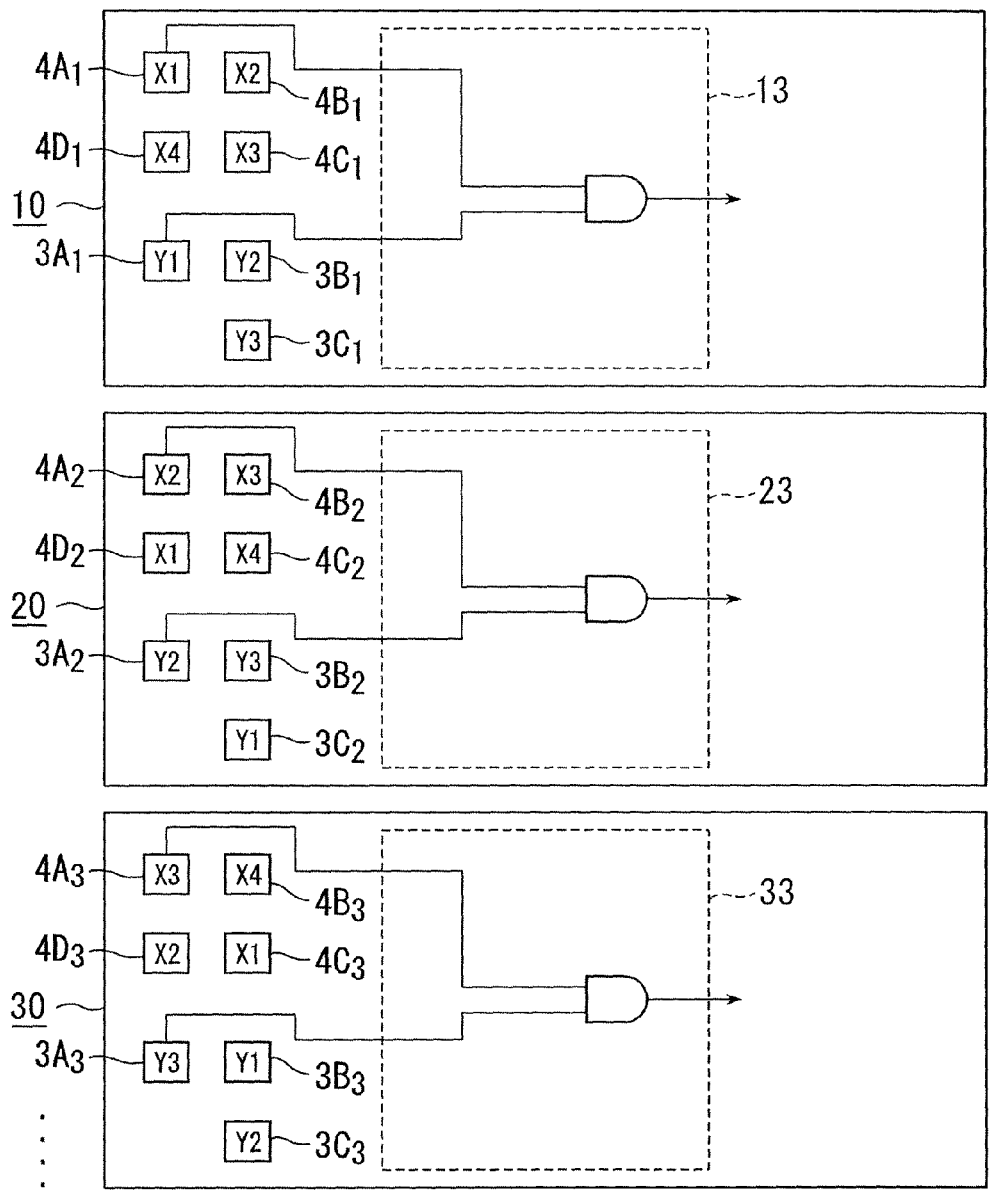
FIG. 16 is a view schematically showing another structure of a semiconductor chip of the second embodiment.

The internal signal generation circuits 13, 23, 33 can be simplified as shown in FIG. 16, wherein each of the internal signal generation circuits 13, 23, 33 is connected only to the specific terminals $4A_n$ and $3A_n$ and is adapted to generate the internal signal only on the basis of the monitoring results of the specific terminals $4A_n$ and $3A_n$.

A DRAM device according to a third embodiment of the present invention comprises a different interface chip which a through-line assertion circuit is not provided for and, when the DRAM device is used, one of the through-lines X1-X4 and one of the through-lines Y1-Y3 are fixedly asserted. In this embodiment, only the through-line X1 and the through-line Y1 are fixedly asserted, for example, by supplying the through-line X1 and the through-line Y1 with VDD, while by supplying the through-line X2-X4 and the through-line Y2, Y3 with GND. In this case, because the combination of the asserted terminals is unique to each DRAM chips, the DRAM chip can acknowledge its layer number by checking the combination of the asserted terminals.

Figure 17:
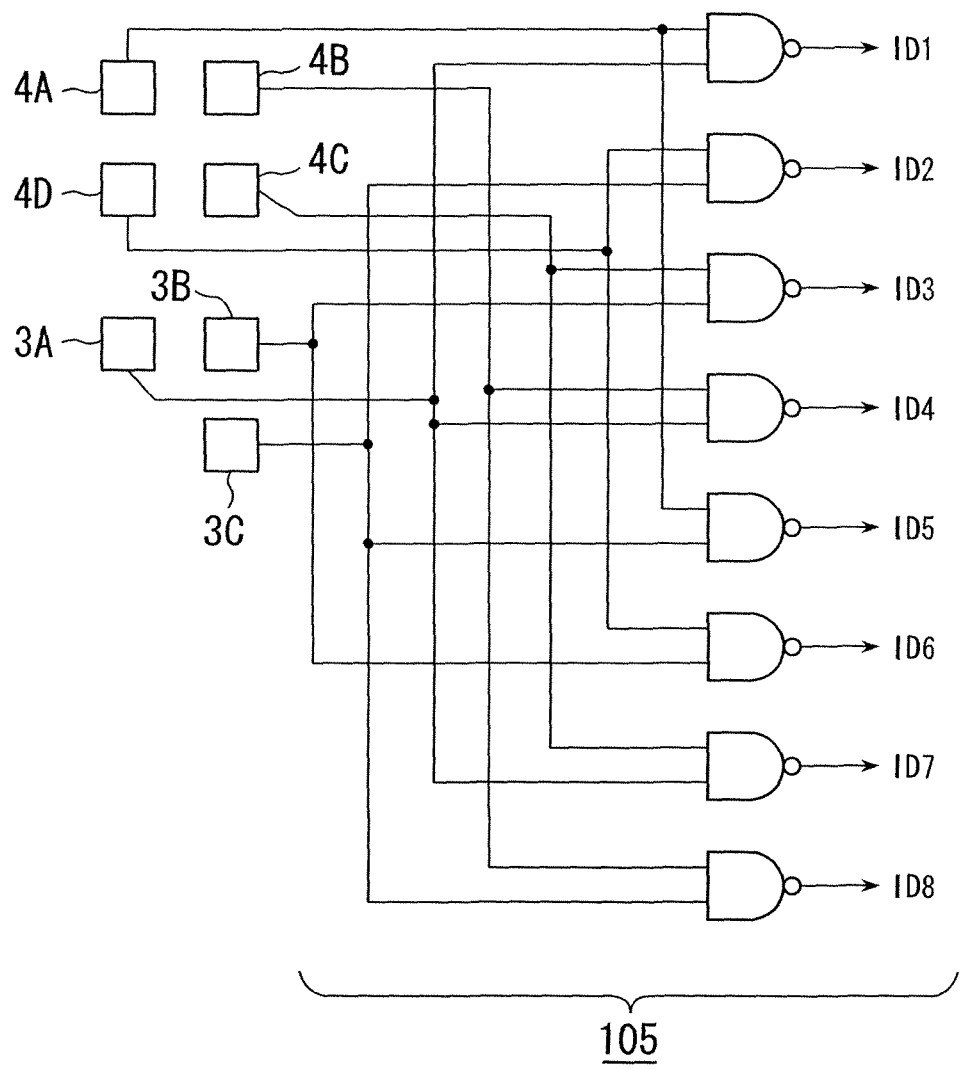
FIG. 17 is a view schematically showing an identification generation circuit included in the semiconductor chip of a third embodiment.

With reference to FIG. 17, an identification generation circuit 105 is provided for each DRAM chip. The identification generation circuit 105 is connected to the terminals 4A-4D and the terminals 3A-3C. The identification generation circuit 105 is adapted to generate an identification signal ID1-ID8 on the basis of the combination of the asserted terminals 4A-4D, 3A-3C, wherein the identification signal ID1-ID8 is indicative of the layer number of the DRAM chip.

Figure 18:
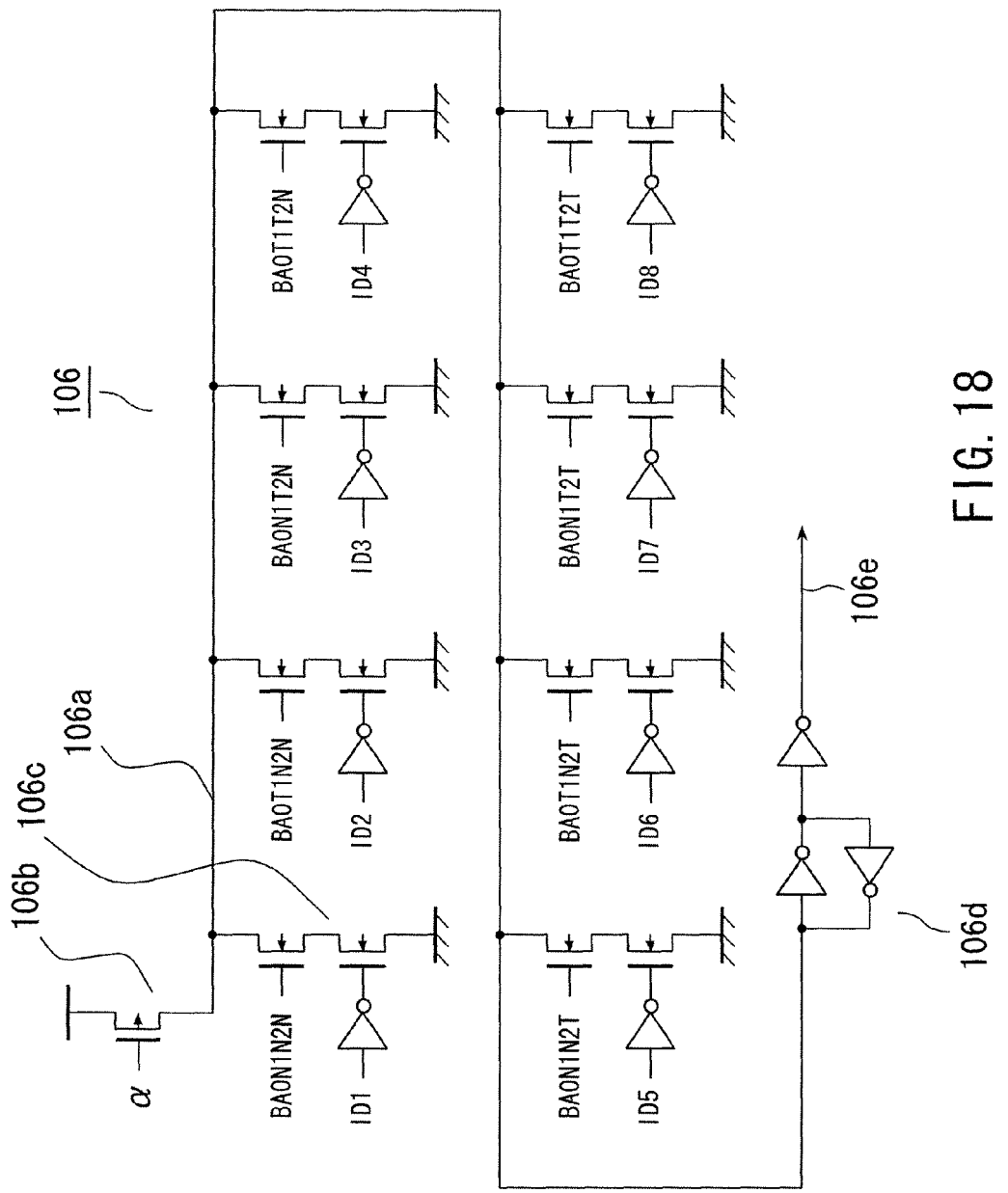
FIG. 18 is a view schematically showing a signal generation circuit connected to the identification generation circuit of FIG. 17.

With reference to FIG. 18, a signal generation circuit 106 comprises a p-ch transistor 106b, two-inputs NAND circuits 106c, eight in number, and a latch circuit 106d. The p-ch transistor 106b is connected between the power supply and the point 106a and is used for pre-charging the point 106a in response to a pre-charge signal α. The pre-charge signal α is changed into low state when the point 106a is to be pre-charged. Each of the NAND circuits 106c is connected between the point 106a and the ground (GND). The latch circuit 106d holds a level of the point 106a and transmits the level to an internal signal line 106e.

One of the inputs for each NAND circuits 106c is a corresponding one of the identification signals ID1-ID8; the other is a layer designation signal indicative of a layer number of the DRAM chip to be designated. The layer designation signal is shown as BA0N1N2N, BA0T1N2N, BA0N1T2N, BA0T1T2N, BA0N1N2T, BA0T1N2T, BA0N1T2T, or BA0T1T2T, where "N" indicates "NOT" (=false:0), while "T" indicates "TRUE" (=1). For example, if only the first layer DRAM chip is to be designated, the layer designation signal BA0N1N2N is asserted, while the other layer designation signals are negated. Likewise, if only the second layer DRAM chip is to be designated, the layer designation signal BA0T1N2N is asserted, while the other layer designation signals are negated. The layer designation signals are obtained by decoding the encoded designation signals, i.e. the bank signals BA0-BA2 in this embodiment. The decoding may be carried out by the interface chip or by each DRAM chip.

Figure 19:
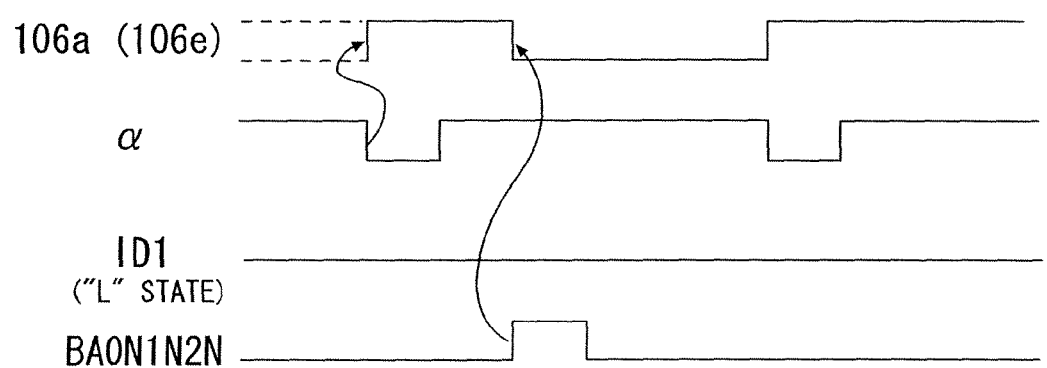
FIG. 19 is a time chart showing an operation of the signal generation circuit of FIG. 18.

With further reference to FIG. 19, explanation is made about an operation of the signal generation circuit 106 which is embedded in the first layer DRAM chip 10. The identification generation circuit 105 of the DRAM chip 10 generates ID1 of low level and ID2-ID8 of high levels. Before the chip selection/designation, the pre-charge signal α is asserted so that the point 106a is pre-charged to have the high level. The pre-charged level is held by the latch circuit 106d and is transmitted to the internal signal line 106e. Under that state, when the first layer DRAM chip 10 is designated with the asserted layer designation signal BA0N1N2N, the corresponding NAND circuit 106c turns ON so that the level of the point 106a is changed into the low level. The change of the point 106a is transmitted to the internal signal line 106e. Thus, the illustrated internal signal generation circuit 106 asserts the internal signal line 106e only upon the match between the layer number of the identification signal and the designated layer number.

Figure 20:
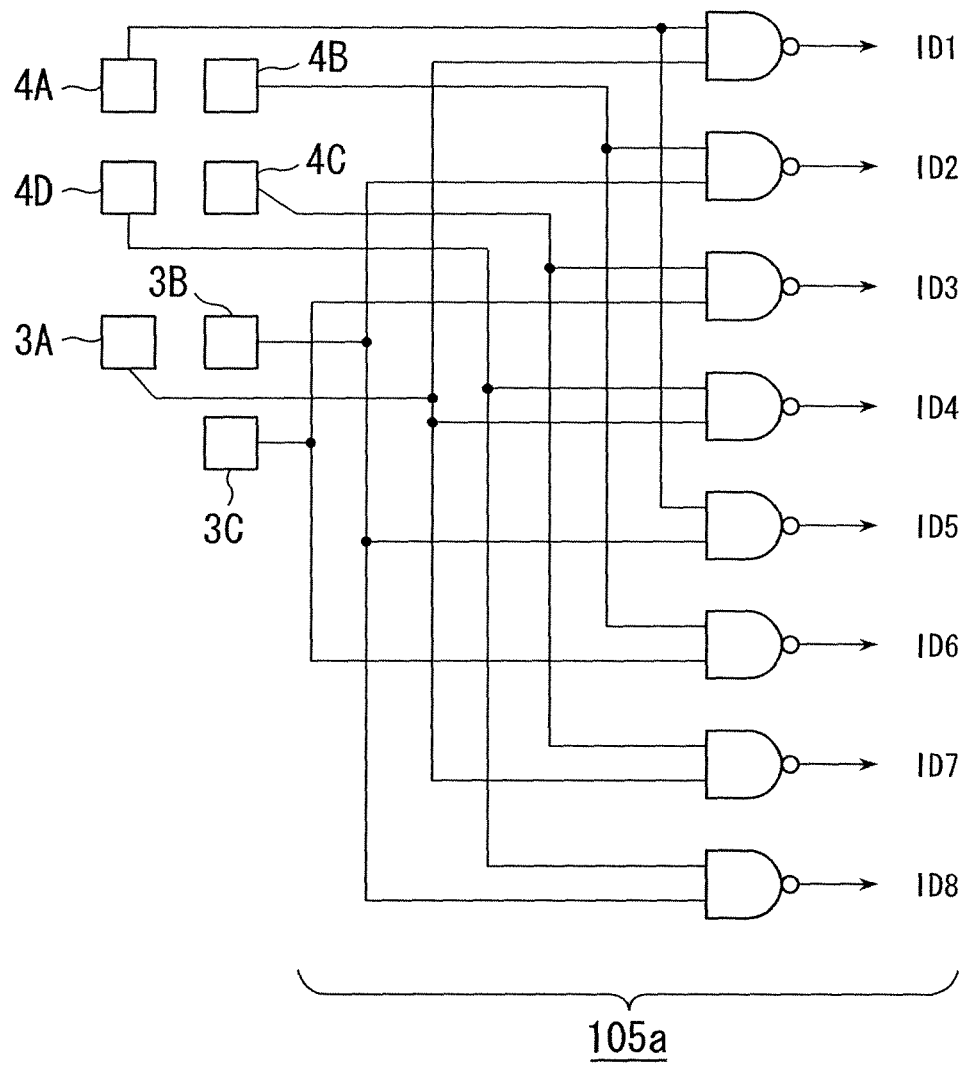
FIG. 20 is a view showing another identification generation circuit in accordance with a combination of the first and the third embodiments.

The preferred embodiments described above can be modified in various manner. For example, the conceptual combination of the first and the third embodiments allows the DRAM chips to have the same structure as each other even if each of the through-lines has a straight form as shown in FIG. 8. FIG. 20 shows an example of another identification generation circuit 105a which allows the conceptual combination of the first and the third embodiments. The DRAM chips can have the same structure as each other; each of the DRAM chips comprises the identification generation circuit 105a shown in FIG. 20 and internal signal generation circuit 106 shown in FIG. 18. In the preferred embodiments, the through-lines are grouped into two or more groups but may form only a single group. In the preferred embodiments, the bank addresses are used as designation signals, but other signals including a chip-select signal may be used. In the preferred embodiment, only one DRAM chip is designated, but two or more DRAM chips can be designated simultaneously, as apparent from their structures.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method comprising:
   forming a plurality of semiconductor chips, each of the semiconductor chips comprising:
   a first surface and a second surface opposite to the first surface;
   a plurality of first terminals arranged apart from each other in substantially parallel to the first surface, the first terminals being provided on a side of the first surface;
   a plurality of first conductive lines each extending vertically with respect to the first surface, each of the first conductive lines being vertically aligned with a corresponding one of the first terminals and electrically isolated from the corresponding one of the first terminals; and
   a plurality of second conductive lines, each of the second conductive lines extending in substantially parallel to the first surface to electrically connect an associated one of the first conductive lines to a different one of the first terminals that is not vertically aligned with the associated one of the first conductive lines; and
   stacking the semiconductor chips with each other such that the first conductive lines of a lower one of the semiconductor chips are electrically connected to the first terminals of an upper one of the semiconductor chips, respectively, and that each of the first terminals of the lowermost one of the semiconductor chips and an associated one of the first conductive lines of the uppermost one of the semiconductor chips, that are vertically aligned with each other, are electrically connected through the second conductive lines.

2. The method as claimed in claim 1, wherein each of the semiconductor chips further comprises a plurality of second terminals provided on a side of the second surface, each of the second terminals being vertically aligned with an associated one of the first conductive lines and electrically connected to the associated one of the first conductive lines; and the stacking the semiconductor chips comprises connecting the second terminals the lower one of the semiconductor chips to the first terminals of the upper one of the semiconductor chips, respectively.

3. The method as claimed in claim 1, wherein the first terminals of each of the semiconductor chips are arranged to correspond to vertices of a polygon.

4. The method as claimed in claim 2, wherein the first terminals of each of the semiconductor chips are arranged to correspond to vertices of a polygon and the second terminals of each of the semiconductor chips are arranged to correspond to vertices of a polygon.

5. A method comprising:
forming a first semiconductor chip that comprises:
a first surface and a second surface opposite to the first surface;
a plurality of first terminals arranged apart from each other in substantially parallel to the first surface, the first terminals being provided on a side of the first surface;
a plurality of second terminals provided apart from each other in substantially parallel to the second surface, the second terminals being provided on a side of the second surface;
a plurality of first conductive lines each extending vertically with respect to the first surface, each of the first conductive lines being vertically aligned with a corresponding one of the first terminals and electrically isolated from the corresponding one of the first terminals, each of the first conductive lines being vertically aligned with a corresponding one of the second terminals and electrically connected to the corresponding one of the second terminals; and
a plurality of second conductive lines, each of the second conductive lines extending in substantially parallel to the first surface to electrically connect an associated one of the first conductive lines to a different one of the first terminals that is not vertically aligned with the associated one of the first conductive lines;
forming a second semiconductor chip that comprises:
a third surface and a fourth surface opposite to the third surface;
a plurality of third terminals provided apart from each other in substantially parallel to the third surface, the third terminals being provided on a side of the third surface;
a plurality of third conductive lines each extending vertically with respect to the third surface, each of the third conductive lines being vertically aligned with a corresponding one of the third terminals and electrically isolated from the corresponding one of the third terminals; and
a plurality of fourth conductive lines, each of the fourth conductive lines extending in substantially parallel to the third surface to electrically connect an associated one of the third conductive lines to a different one of the third terminals that is not vertically aligned with the associated one of the third conductive lines; and
stacking the first and second semiconductor chips with each other such that the second terminals of the first semiconductor chip are electrically connected to the third terminals of the second semiconductor chip, respectively, and that each of the first terminals of the first semiconductor chip and an associated one of the third conductive lines of the second semiconductor chip, that are vertically aligned with each other, are electrically connected through the second and fourth conductive lines.

6. The method as claimed in claim 5, wherein the first terminals of the first semiconductor chip are arranged to correspond to vertices of a polygon, the second terminals of the first semiconductor chip are arranged to correspond to vertices of a polygon, and the third terminals of the second semiconductor chip are arranged to correspond to vertices of a polygon.

7. The method as claimed in claim 5, wherein the second semiconductor chip further comprises a plurality of fourth terminals provided on a side of the fourth surface, each of the fourth terminals being vertically aligned with a corresponding one of the third conductive lines and electrically connected to the corresponding one of the third conductive lines.

8. The method as claimed in claim 7, wherein the first terminals of the first semiconductor chip are arranged to correspond to vertices of a polygon, the second terminals of the first semiconductor chip are arranged to correspond to vertices of a polygon, the third terminals of the second semiconductor chip are arranged to correspond to vertices of a polygon, and the fourth terminals of the second semiconductor chip are arranged to correspond to vertices of a polygon.

9. The method as claimed in claim 5,
wherein the method further comprises forming the first semiconductor chip in plural to prepare a plurality of the first semiconductor chips; and
wherein the stacking comprises:
stacking the first semiconductor chips with each other such that the second terminals of a lower one of the first semiconductor chips are connected to the first terminals of an upper one of the first semiconductor chips, respectively; and
stacking the second semiconductor chip over the uppermost one of the first semiconductor chips such that the second terminals of the uppermost one of the first semiconductor chips are connected to the third terminals of the second semiconductor chip, respectively, and that each of the first terminals of the lowermost one of the first semiconductor chips and an associated one of the third conductive lines of the second semiconductor chip, that are vertically aligned with each other, are electrically connected through the second and fourth conductive lines.

10. The method as claimed in claim 9, wherein the first terminals of each the first semiconductor chips are arranged to correspond to vertices of a polygon, the second terminals of each of the first semiconductor chips are arranged to correspond to vertices of a polygon, and the third terminals of the second semiconductor chip are arranged to correspond to vertices of a polygon.

11. The method as claimed in claim 9, wherein the second semiconductor chip further comprises a plurality of fourth terminals provided on a side of the fourth surface, each of the fourth terminals being vertically aligned with a corresponding one of the third conductive lines and electrically connected to the corresponding one of the third conductive lines.

12. The method as claimed in claim 11, wherein the first terminals of each of the first semiconductor chip are arranged to correspond to vertices of a polygon, the second terminals of each of the first semiconductor chip are arranged to correspond to vertices of a polygon, the third terminals of the second semiconductor chip are arranged to correspond to vertices of a polygon, and the fourth terminals of the second semiconductor chip are arranged to correspond to vertices of a polygon.

* * * * *